United States Patent [19]
Morgan et al.

[11] Patent Number: 5,227,223
[45] Date of Patent: Jul. 13, 1993

[54] FABRICATING METAL ARTICLES FROM PRINTED IMAGES

[75] Inventors: Albert W. Morgan, Chesterfield; George D. Vaughn, Ballwin, both of Mo.

[73] Assignee: Monsanto Company, St. Louis, Mo.

[21] Appl. No.: 713,246

[22] Filed: Jun. 7, 1991

Related U.S. Application Data

[63] Continuation-in-part of Ser. No. 609,718, Nov. 13, 1990, Pat. No. 5,082,734, and a continuation-in-part of Ser. No. 569,882, Aug. 20, 1990, abandoned, and a continuation-in-part of Ser. No. 454,565, Dec. 21, 1989, abandoned.

[51] Int. Cl.$^5$ ............................................. B32B 9/00
[52] U.S. Cl. .................................... 428/209; 428/221; 428/332; 428/457; 428/901; 174/257; 361/398
[58] Field of Search ............... 361/398; 428/209, 901, 428/457, 333, 221, 332; 174/257, 251, 250; 430/311, 313

[56] References Cited

U.S. PATENT DOCUMENTS

| | | | |
|---|---|---|---|
| 3,745,045 | 7/1973 | Brenneman et al. | 117/212 |
| 4,248,921 | 2/1981 | Steigerwald et al. | 428/148 |
| 4,322,457 | 3/1982 | Baron et al. | 427/259 |
| 4,368,281 | 1/1983 | Brummett et al. | 523/458 |
| 4,469,714 | 9/1984 | Wada et al. | 427/54.1 |
| 4,493,861 | 1/1985 | Sirinyan et al. | 427/304 |
| 4,622,411 | 11/1986 | Sirinyan et al. | 556/136 |
| 4,670,351 | 6/1987 | Keane et al. | 428/549 |
| 4,832,989 | 5/1989 | Giesecke et al. | 427/306 |
| 4,900,618 | 2/1990 | O'Connor et al. | 428/328 |
| 4,910,072 | 3/1990 | Morgan et al. | 428/212 |

FOREIGN PATENT DOCUMENTS

| | | |
|---|---|---|
| 1271374 | 7/1990 | Canada . |
| 0132677 | 7/1984 | European Pat. Off. . |
| 59-038370 | 3/1984 | Japan . |
| 62-078179 | 4/1987 | Japan . |
| 63-270474 | 11/1988 | Japan . |
| WO87/04190 | 7/1987 | PCT Int'l Appl. . |
| WO88/02592 | 4/1988 | PCT Int'l Appl. . |
| 938365 | 10/1963 | United Kingdom . |

Primary Examiner—Patrick J. Ryan
Assistant Examiner—William A. Krynski
Attorney, Agent, or Firm—Thomas E. Kelley; Mark F. Wachter

[57] ABSTRACT

Methods for fabricating two-dimensional imaged metal articles on webs by electroless deposition of metal onto a catalytic pattern rotogravurely printed onto moving webs travelling at linear speeds of up to 500 meters/minute using low viscosity catalytic ink comprising polymer and compound, complex or colloid of a Group 1B or Group 8 metal. Such two-dimensional imaged metal articles comprise areas or fine lines, e.g. less than 100 micrometers wide, which are useful as electrical devices such as circuit connectors, antennas and the like or as mechanical devices such as levers, gears and the like. With modification of the metal component or addition of other materials, such two-dimensional imaged metal articles can be useful a electronic devices such as diodes, resistors, capacitors and the like or as energy conversion devices such as batteries, sensors or fuel cells. The catalytic inks have appropriate rheological properties of viscosity and surface tension that permit non-sagging, non-spreading images to be printed onto a web which can travel vertically into a drying zone.

8 Claims, 1 Drawing Sheet

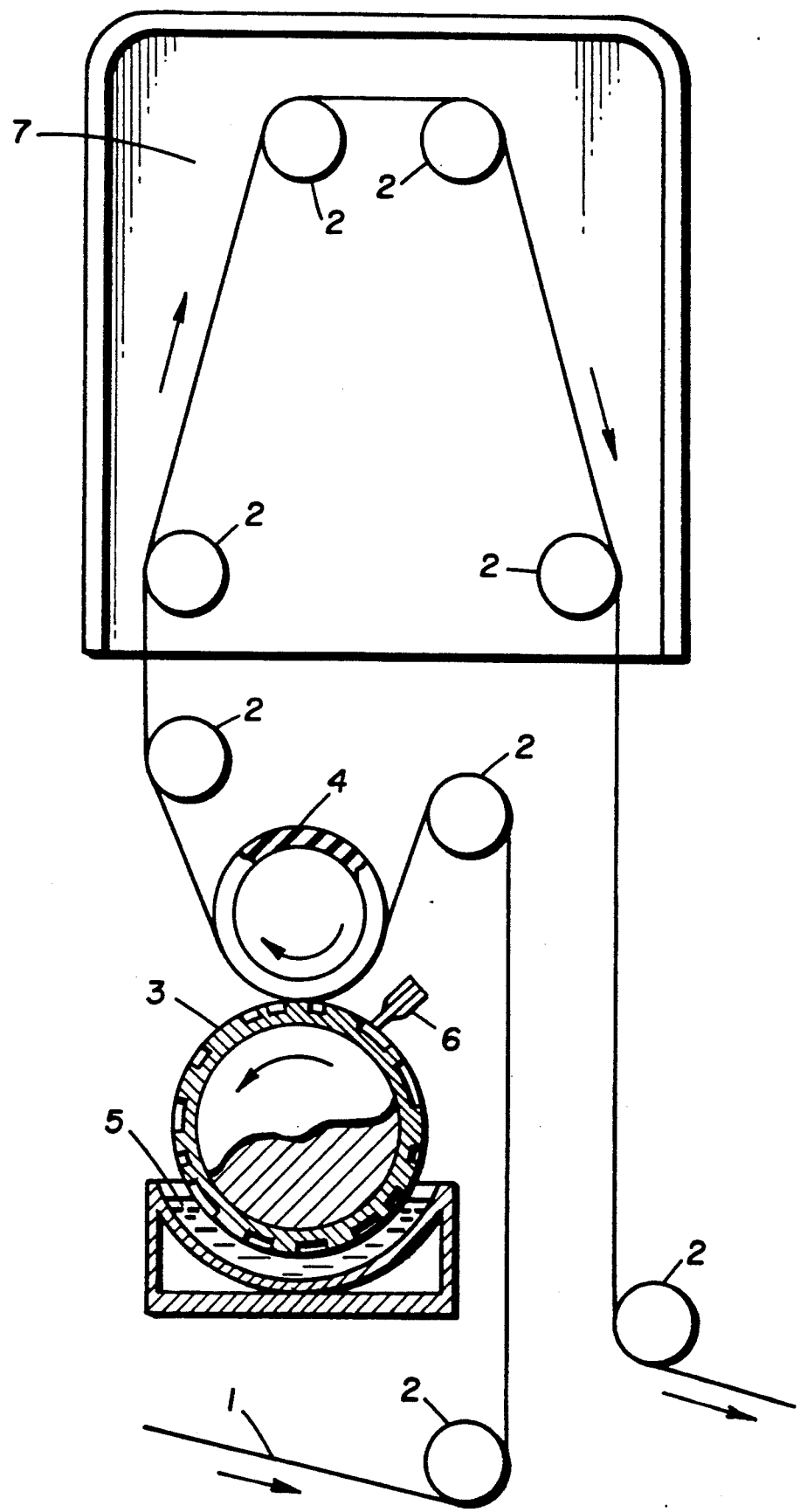

FABRICATING METAL ARTICLES FROM PRINTED IMAGES

This application is a continuation-in-part of Ser. No. 07/609,718 filed Nov. 13, 1990, now U.S. Pat. No. 5,082,734 and a continuation-in-part of Ser. Nos. 07/569,882, now abandoned filed Aug. 20, 1990 and 07/454,565, now abandoned filed Dec. 21, 1989, all of which are incorporated herein by reference.

Disclosed herein are methods for fabricating metal-containing articles by printing catalytic inks which are adapted to be catalytic to electroless deposition and growing metal on a catalytic pattern.

BACKGROUND OF THE INVENTION

Printing using catalytic inks has been practiced for producing patterns which are catalytic to electroless deposition for producing a variety of products including printed circuitry an decorative metal patterns. Typically catalytic inks contain a metal for catalyzing electroless deposition, e.g. copper, silver or a noble metal such as palladium. Such inks are used to produce catalytic patterns on a non-conductive substrate, e.g. by screen printing, by lettering from a felt tip pen, by ink-jet processes and the like. The metal components for catalytic inks have been in a variety of physical forms, e.g. dissolved salts, colloidal hydrosols, and particulates such as powder or flake. The inks have a wide range of rheological properties depending on the intended method of application. For instance, inks for application by ink-jet have especially low viscosity and consist essentially of palladium salt in an organic solvent. Inks for screen printing have especially high viscosity, e.g. are referred to as pastes, and consist typically of polymer binder and particulate metal.

The following patent publications disclose the production of printed circuit boards by electroless deposition on a catalytic ink pattern. EPO publication 0 132 677 discloses low viscosity ink (e.g. 0.3–100 cp) comprising a catalytic metal solution which is applied to a surface by an ink-jet or ink-mist process.

In U.S. Pat. Nos. 4,493,861 and 4,622,411 a catalytic pattern is formed by spraying through a template a palladium-containing alkyl resin solution; the patterned resin is hardened for 5 hours then electrolessly deposited with nickel. U.S. Pat. No. 4,622,411 also discloses the silk screen printing of palladium-containing prepolymer which is cured for 8 hours prior to electroless deposition of nickel.

In U.S. Pat. No. 4,322,457 catalytic patterns are formed by printing a surfactant ink which is dried, treated with a sensitizing agent, e.g. a tin salt, then catalyzed by treating with a palladium solution.

In U.S. Pat. No. 3,745,045 catalytic inks are based on epoxy paint containing metal flakes, e.g. of nickel or aluminum.

Screen printing of catalytic patterns requires the use of pastes having high viscosity due to high solids levels and particulates. Because of their viscosity such pastes typically have long drying times, e.g. at least about 1 hour. For instance, in U.S. Pat. No. 4,248,921 the paste comprises metal particles, metal salt and polymer; in U.S. Pat. No. 4,469,714 the paste comprises a thermosetting or U.V. curable resin containing finely divided palladium catalyst; in U.S. Pat. No. 4,832,989 pastes comprise copolymer binder, palladium compounds and inorganic particulate such as aerosols, titanium dioxide, talc and the like and illustrative pastes dry in about 1 hour at 100° C.; in British Patent Specification 938,365 high viscosity (i.e. 200 poise) catalytic inks comprise phenolic resin, powdered metal (e.g. aluminum) and powdered silica; in Canadian Patent 1,271,374 pastes comprise a palladium compound and inorganic filler in a polyurethane solution and illustrative pastes dry in about 1 hour at 150° C.; in PCT publication WO 88/02592 pastes comprise copolymer binder, inorganic particulate and palladium compounds and illustrative pastes dry in about 30 minutes at 150° C.; in PCT publication WO 87/04190 high viscosity (15,000–200,000 cp) inks comprise polymer and metallic powder; and in U.S. Pat. No. 4,670,351 high viscosity (15,000 to 200,000 cp) inks comprise curable silicone and finely divided metal powder.

Japanese Kokai 59038370 discloses catalyst of fine metal powder in a polymeric binder; Japanese Kokai 62207878 discloses catalytic paste containing a palladium hydrosol, a surfactant and a water soluble binder; Japanese Kokai 62078179 discloses printing paste of high melt point metal powders; and Japanese Kokai 63270474 discloses aqueous catalytic ink comprising 0.2–0.8 wt. % silver salt, 40–60 wt. % starch base binder, 0.2–1.3 wt. % silane coupling agent and 0.5–3.5 wt. % sulfur compound.

Despite the variety of printing inks and techniques disclosed as useful for producing printed circuitry and other conductive metal devices, a major deficiency is the slow speed of the methods. For instance, the disclosed screen printing is typically carried out on stationary substrates using slow drying paste requiring a large holding area to dry the printed image. Although screen printing can be applied to a moving web, such processing is impractical due to the slow drying associated with typically disclosed pastes. Moreover, such pastes typically contain high levels of particulate solids which preclude the use of pastes for fine imaging. Although low viscosity inks are disclosed, the associated printing techniques, e.g. spraying through a template or ink-jet printing, are not typically fast when applied to moving webs.

Many of the problems of the prior art are overcome by the high speed printing methods of U.S. Pat. No. 4,368,281 which discloses the production of flexible printed circuits having line widths as little as 10 mils (250 micrometers) using a variety of printing techniques, e.g. flexographic, silk screen, intaglio, at speeds of 25–260 ft/min (8–80 meters/min) using a catalytic printing ink containing 12–15 percent by weight solids (palladium complex, a polymeric resin adhesive, pigment filler and crosslinking agent) and up to 88 percent by weight solvent. Depending on the printing technique, ink viscosity is adjusted e.g. 4000 cp for screen printing, 300–1200 for flexographic printing and 80–350 cp for intaglio printing, using a variety of fillers, preferably ferric oxide, or fast evaporating solvents, e.g. trichloroethane. It is disclosed that the ink should contain 8–15 weight percent filler. After drying in a hot (80°–110° C.) air blast, the ink is crosslinked by baking at 90°–100° C. for about a minute. Intaglio printing utilizes an engraved roll in which the web is deformed into the cavities to contact ink.

An object of this invention is to provide a improved method for fabricating articles such as printed circuits by electroless deposition on catalytic images formed on moving webs traveling at high speeds, e.g. up to 500 meters/minute, using catalytic inks comprising low levels of solids comprising polymer and catalytic metal.

Another object of this invention is to provide a method for printing on moving webs catalytic images in fine line widths, e.g. less than 100 micrometers, and as narrow as about 25 micrometers, which can be metal plated for utility as electrical, electronic, energy conversion and/or mechanical devices.

Still another object of this invention is to provide continuous methods of printing, drying and activating images of catalytic ink on moving webs and plating metal on the activated-imaged moving web.

These and other objects that will be apparent from the advantages described in the following specification and illustrative examples are met by the invention set forth in the following claims for methods of producing articles using catalytic inks.

SUMMARY OF THE INVENTION

This invention provides methods for fabricating two-dimensional imaged metal articles on webs by electroless deposition of metal onto a catalytic pattern. More particularly, the invention is directed to printing methods for applying two-dimensional catalytic patterns onto moving webs. Such catalytic patterns are formed from low viscosity catalytic inks comprising low levels of solids including polymer and a Group 1B or Group 8 metal compound, complex or colloid. A preferred technique for printing images that are adaptable to electroless deposition of metal is gravure printing of such catalytic ink, e.g. from a rotating gravure roll, onto a moving web traveling at linear speeds of 3 to 500 meters/minute.

The catalytic inks used in the methods of this invention are low in solids, e.g. less than 10% solids, and have appropriate rheological properties of viscosity and surface tension that permit non-sagging, non-spreading images to be printed onto a web which moves vertically into a drying zone. Useful catalytic inks have low viscosity, e.g. about 20-600 centipoises (cp), preferably 50-500 cp. Such inks allow the printing of images having fine dimensions in both transverse and parallel to the direction of web travel. Such fine dimensions are manifested by fine lines of less than 100 micrometers in width, preferably not greater than 80 micrometers. In some cases advantageous images comprise fine lines of widths not greater than 50 micrometers, even more preferably not greater than 25 micrometers.

The methods of this invention are advantageously useful for fabricating on webs two-dimensional imaged metal articles comprising metal lines or areas which are useful as electrical devices such as circuit connectors, antennas and the like or as mechanical devices such as levers, gears and the like. With modification of the metal component or addition of other materials, such two-dimensional imaged metal articles can be useful as electronic devices such as diodes, resistors, capacitors and the like or as energy conversion devices such as batteries, sensors or fuel cells. Such articles can be functionally used on the web, e.g. in the case of circuits, or can be mechanically separated from the surface of the web on which they were grown, e.g. in the case of fine gears.

Thus another aspect of this invention provides metal images on webs having fine dimensions, e.g. as low as 25 micrometers or less.

BRIEF DESCRIPTION OF THE DRAWINGS

FIG. 1 is a schematic illustration of a rotogravure printing apparatus for practicing the method of this invention.

DETAILED DESCRIPTION OF PREFERRED EMBODIMENTS

The term "Nickel Bath" as used in the following examples refers to an agitated electroless nickel plating bath (obtained from MacDermid identified as XD7054EN) comprising 6 g/l nickel and 30 g/l sodium hypophosphite monohydrate adjusted to pH 5.5 with ammonium hydroxide solution and maintained at about 60° C.

The term "Copper Bath" as used herein refers to an agitated electroless plating solution comprising about 8 g/l formalin, about 4 g/l copper, and about 0.12M ethylenediaminetetraacetic acid and which is maintained at pH 11.5–12.5 and about 35° C.

The viscosity of catalytic inks set forth in the following description and claims is reported in centipoises (cp) and determined using a Brookfield viscometer with a No. 1 spindle rotating at 100 rpm in 25° C. ink.

As used herein the term gravure roll means a rotating printing roll having engraved image forming cavities and is useful in what is known as rotogravure and intaglio printing.

The methods of this invention are advantageously useful for fabricating metal articles on webs such as polymeric films, paper or textiles, e.g. woven and nonwoven fabrics. Webs specifically adapted to accepting inks are commonly available. Such metal articles comprise two-dimensional imaged metal devices comprising conductive metal lines or areas which can be used as (a) electrical devices such as circuit connectors, antennas, induction heaters, radiation reflectors and (b) mechanical devices such as miniature axles, gears, wheels and levers. With further modification, e.g. by oxidation of part of the metal in a conductor or by application of one or more layers of metal oxide, dielectric, electrolyte, electrochromic or liquid crystal material, etc., such two-dimensional devices can be transformed for use as (c) electronic devices including diodes, capacitors, transistors, resistors, inductors, pi circuits and the like, and (d) energy conversion devices including batteries, sensors, fuel cells and the like. In some cases devices can be fabricated using a single two-dimensional metal pattern coated with a functional layer, e.g. force sensing resistors can be fabricated by coating a conductive elastomeric onto a pattern comprising a pair of interdigitated metal lines. In other cases devices can be fabricated by coating onto a first electrode layer of a grid of conductive lines an electrochemically functional polymer layer; a second electrode layer of a grid of conductive lines is applied onto the polymer layer to provide an energy conversion device. It may be desirable to combine two or more separate embodiments of two-dimensional metal devices, for instance by interconnecting them electrically or mechanically, to provide complex devices where two-dimensionally imaged metal provide multiple functions. Such two-dimensional imaged metal articles can be functionally used on the web, e.g. in the case of circuits, or can be mechanically separated from the surface of the web on which they were grown, e.g. in the case of fine gears. Depending on the application two-dimensional imaged metal can be applied to one or both sides of a web to provide similar, different or a variety of devices on either or both sides of the web.

In the methods of this invention two-dimensional imaged metal articles are grown on a web by electrolessly depositing metal, e.g. copper, iron, cobalt, tin, gold, palladium, platinum, nickel, silver and the like, onto a catalytic two-dimensional image on the surface of a web. Especially preferred devices for some applications have electrolessly deposited copper of high ductility, e.g. at least 8%. Such articles can comprise one or more metal layers. It is advantageous to apply the initial metal layer by electroless deposition onto a catalytic image. Subsequent metal layers can be provided by electroless deposition, electrolytic deposition or metal replacement, e.g. silver replacement of copper.

Catalytic two-dimensional images printed on a web using catalytic inks comprising polymer and catalytic metal of Group 1B or Group 8 metal are adaptable to electroless deposition of metal to grow the article on said web. Useful Group 1B metals include copper, silver and gold. Useful Group 8 metals include iron, cobalt, nickel, ruthenium, rhodium, palladium, osmium, iridium and platinum. Because of its toxicity, the use of osmium is preferably avoided. Because of its catalytic activity for electroless deposition, palladium is the preferred metal for the catalytic inks of this invention. Such catalytic metal is advantageously employed in the catalytic inks as colloidal metal, preferably colloids less than 10 nanometer particles, as soluble compounds, e.g. salts, or complexes of reducible metal ions or soluble complexes of zero valent metal, e.g. tetrakis(triphenylphosphine)nickel(0). When inks contain reducible ions of metal having lower electrochemical potential, e.g. copper, iron, cobalt or nickel, such metals often require reduction prior to electroless deposition using a reducing agent stronger than reducing agents typically found in electroless deposition solutions. The catalytic inks advantageously comprise surfactants, e.g. for stabilizing polymer emulsions or promoting wetting of substrates, chelants, complexing agents and stabilizers. Ligands useful for solubilizing metal ions or complexing the metal and stabilizing the inks include non-ionic compounds such as acetonitrile, acetone and triethylamine and ionic species such as acetate, nitrate, chloride and ammonium. The use of volatile complexing agents, such as acetone, ammonia or triethyamine, is preferred in many applications. Ionic ligands are advantageously provided as non-catalytic metal salts, e.g. Group 1A and Group 2A metal salts, having anions that can form ligands with the catalytic metal. The use of a preferred salt such as potassium acetate with palladium compounds enhances the efficacy of the catalytic film. In some cases, e.g. to register printed webs, it is useful to employ coloring agents, e.g. dyes or pigments.

The catalytic inks of this invention comprise not more than about 10 percent (by weight) solids, i.e. polymer, metal compounds or complexes and complexing and stabilizing agents. Preferred inks comprise not more than about 5 percent of the polymer component and not more than 2 percent of catalytic metal. More preferred inks comprise not more than 2 percent polymer and not more than 1 percent catalytic metal. Useful solutions for catalytic inks comprising polymer and catalytic metal are disclosed in U.S. Pat. Nos. 4,900,618 and 4,910,072 and in application Ser. No. 07/609,718, disclosures of which are incorporated herein by reference. Preferred polymers include vinyl polymers such as polyvinyl chloride and polyvinyl alcohol, cellulosics such as methylcellulose and hydroxypropyl methylcellulose polymers, unsaturated polymers such as polybutadiene, inorganic polymers such as polysilico (e.g. colloidal silicon dioxide), and emulsions of thermoplastic polymers dispersed by polymeric surfactant such as a polyoxyethylene.

In the methods of this invention the catalytic inks are preferably rapidly drying so that the webs can be moved at sufficiently high speeds through printing apparatus for further processing, e.g. activation of the ink and/or electroless deposition, or for storage, e.g. as stacked sheets or wound rolls. The use of low solids inks in low boiling, volatile solvents allows for sufficiently rapid drying of moving webs to accommodate continuous on-line printing. Useful solvents can comprise water, alcohols such as methanol, ethanol, propanol and isopropanol, N-methylpyrrolidone, aromatics such as benzene, toluene and xylene, ketones such as acetone, ethers such as ethyl ether, esters such as ethyl acetate or mixtures thereof. Such drying can be advantageously effected by exposing moving webs to moderate temperature environments for short time, e.g. in a forced air heated plenum. In many cases depending on the solvent it may be preferable to employ temperatures not substantially greater than 100° C. to avoid disturbing the film formed by the drying ink, e.g. by rapid evaporation of solvent. For instance, catalytic inks printed on webs traveling at about 60 meters/minute were adequately dried with residence time of about 2 seconds in an 80° C. air plenum.

Depending on its composition the ink may be adapted, e.g. activated, to electroless deposition upon drying or further processing, e.g. formation of clusters, reduction, removal of volatile ligands, etc., may be required to render the dried ink catalytic to electroless deposition. For instance, film-forming solutions of polymer and catalytic metal as disclosed in U.S. Pat. Nos. 4,910,072 and 4,910,072 and in application Ser. No. 07/609,718 can be advantageously used as catalytic inks where it is desired to provide catalytically inert images which can be selectively activated to electroless deposition, e.g. by the focused application of energy. Ink activation can be advantageously achieved by exposing the dried ink to radiant energy, e.g. laser, U.V., IR or microwave radiation, electron beam or heat. Heat activation can be effected on-line or off-line. On-line activation can be achieved by passing the web through a forced air plenum heated to temperatures over 200° C., e.g. up to about 500° C. Activation at high temperatures, e.g. above the glass transition temperature (Tg) of the substrate web, can be tolerated provided exposure to heat is for a sufficiently short duration such that the bulk temperature of the web does not exceed the Tg. In preferred methods such heat activation is conducted at high temperatures for a short time, e.g. not more than 20 seconds, to allow continuous printing, drying, activation and plating of a moving web. By providing sufficiently high forced air temperatures, shorter activation time, e.g. not more than 10 seconds or less can facilitate such continuous operation. In off-line activation energy can be applied, e.g. where the printed web is in the form of rolls or stacked sheets, by storing the rolled webs or stacked sheets in a heated environment.

The catalytic inks useful in the methods of this invention for application by gravure printing have rheological properties of viscosity and surface tension that permit non-sagging, non-spreading images to be printed onto a web travelling at linear speeds of 3-500 meters per minute. For many applications, such catalytic inks will have a viscosity between 20 and 600 cp, preferred inks will have a viscosity of 50 to 500 cp; more preferred inks will have a viscosity of 100 to 300 cp.

The methods of this invention are especially adapted to printing fine images both in the direction of travel of the moving web and in the transverse direction. Thus, in another aspect of this invention articles with fine dimensions, e.g. line widths less than 100 micrometers, can be grown from catalytic ink images where such images have at least one dimension both in and transverse to the direction of motion of the web which is less than 100 micrometers, preferably less than 80 micrometers or smaller, for instance less than 50 micrometers. In certain more preferred cases extremely fine articles can be grown by electroless deposition onto catalytic images printed according to this invention where the dimensions are not significantly greater than 25 micrometers. In addition the methods of this invention allows for complex images, e.g. interdigitated lines, where less than 50 percent of the surface bounding the image is covered with said ink.

With reference to FIG. 1 there is schematically illustrated a moving web 1 passed through a rotogravure printing apparatus where the rollers 2. The web passes at linear speeds of up to 500 meters/minute through the nip between engraved gravure roll 3 and press roll 4. The gravure roll is engraved with image forming cavities of typical dimensions of 10–80 micrometers in depth and 10–50 micrometers wide. The gravure roll can be constructed of laminated metals, e.g. a steel roller having a soft metal layer, e.g. copper, into which the desired image-forming cavities are engraved; after engraving the cavity-filled copper layer is commonly coated with a durable metal layer, e.g. chromium. The diameter of the gravure roll can vary considerably, e.g. between about 0.1 and 0.5 meters or larger. In the printing process the gravure roll rotates through an ink well 5 where catalytic ink is imbibed into the image-forming cavities. A doctor blade 6 cleans excess ink from the surface of the rotating roll. Centrifugal force imparted to the ink by the rotation throws the ink onto the web passing through the nip. As is the case with non-catalytic printing inks, it may be advantageous to employ "electro assist" techniques where an electrostatic charge (e.g. 1-2 kilovolts) between the web and the gravure roll promotes the throw of ink from the roll. The web printed with wet ink passes through a drying plenum 7 which is typically heated with forced air, including air heated by direct mixing with combustion gases to facilitate drying of the ink, i.e. solvent removal. The plenum is conveniently ventilated to prevent saturation with evaporated solvent components. The following examples serve to illustrate certain embodiments and aspects of this invention but are not intended to imply any limitation of the scope of the invention.

EXAMPLE 1

This example illustrates the preparation of catalytic inks useful in this invention.

A catalyst ink comprising 0.24 weight percent palladium and 0.2 weight percent polyvinyl alcohol was prepared by dissolving 80 g of palladium acetate in a mixture of 1600 ml water and 320 ml of concentrated ammonium hydroxide; the molar ratio of ammonia to palladium was 13.7; the palladium solution was added to a solution of polyvinyl alcohol (M.W. 125,000; 88 mole percent hydrolyzed) in water to provide CATALYST INK A having a viscosity of about 20 cp.

A catalyst ink comprising 0.47 weight percent palladium and 0.6 weight percent polyvinyl alcohol was prepared by dissolving 160 g of palladium acetate in a mixture of 1600 ml water and 656 ml of concentrated ammonium hydroxide; the molar ratio of ammonia to palladium was 14.1; the palladium solution was added to a solution of polyvinyl alcohol in water to provide CATALYST INK B having a viscosity of about 20 cp.

A catalyst ink comprising 0.1 weight percent palladium and 0.4 weight percent polyvinyl alcohol was prepared by dissolving 35 g of palladium acetate 40 g of potassium acetate and 800 ml of acetone in 160 ml water; the palladium solution was added to a solution of polyvinyl alcohol in water to provide CATALYST INK C having a viscosity of about 20 cp.

A catalyst ink comprising 0.09 weight percent palladium and 0.28 weight percent hydroxypropyl methylcellulose (HPMC) was prepared by dissolving 14.4 g of palladium acetate, in a mixture of 908 ml of acetone and 120 ml of water; the palladium solution was added to a mixture of 2240 g of a 1 percent by weight aqueous solution of HPMC (Dow Methocel J75MS) and 0.3 percent by weight of triethanolamine, 8.25 g of a 25 percent by weight solution of polyoxyethylene surfactant (Texaco Surfonic N95) and 4732 g water to provide CATALYTIC INK D having a viscosity of about 50 cp.

A catalyst ink comprising 0.26 weight percent palladium and 0.5 weight percent HPMC, was prepared by dissolving 43.34 g of palladium acetate, in a mixture of 175 g of ammonium hydroxide and 800 ml of water; the palladium solution was added to a mixture of 3920 g of a 1 percent by weight aqueous solution of HPMC (Dow Methocel J12MS), and 8 g of a 25 percent by weight solution of polyoxyethylene ethylene surfactant (Rohm & Haas Triton X-100) to provide CATALYTIC INK E having a viscosity of about 50 cp.

EXAMPLE 2

Moving webs of polyethylene terephthalate (PET) film (Hoechst-Celanese 5906 PET film) were fed at linear speeds of 30 meters/minute through a rotogravure printing apparatus as schematically illustrated in FIG. 1. CATALYTIC INKS A-C of Example 1 were picked up by a gravure roll and printed in continuously repeating patterns on the PET film which passed vertically from the gravure roll to a drying plenum carrying heated (40°-80° C.) air, residence time in the drying plenum was 3 seconds providing a film printed with a catalytically inert image. The printed film with dried ink was activated by passing at a speed of 3 meters/minute through an activation plenum heated with a 160° C. air flow; residence time was 12 seconds. Upon exiting the activation plenum, the moving web was plated with nickel by contact coating from a rotating nap roll saturated with Nickel Bath solution. Nickel was also electrolessly deposited onto the catalytic images by passing webs through a Nickel Bath at a residence time of 5 minutes.

CATALYTIC INKS D and E were printed onto moving webs (100 meters/minute) of PET film using a gravure roll engraved with a printed circuit test pattern (IPC-A-42) and passed vertically to a drying plenum flowing with 70° C. air to provide catalytically inert images. Spools of the films was passed at 5 meters/minute through an activation plenum heated with 350° C.

air (residence time 9 seconds). Segments of the activated films were immersed in Nickel Baths and Copper Baths to deposit continuously repetitive nickel and copper images of the test pattern. Metal lines as narrow as 25 micrometers were deposited both transverse and parallel to the direction of web travel.

While specific embodiments have been described, it should be apparent to those skilled in the art that various modifications thereof can be made without departing from the true spirit and scope of the invention. Accordingly, it is intended that the following claims cover all such modifications within the full inventive concept.

What is claimed is:

1. A web having on at least one side thereof repetitive patterns of conductive metal lines having a width not greater than 50 micrometers.

2. A web according to claim 1 wherein said width is not greater than 25 micrometers.

3. A web according to claim 1 wherein at least part of said metal lines functions as a circuit connector, induction heater, radiation reflector, antenna, axle, gear, wheel, lever or combination thereof.

4. A web according to claim 2 wherein at least part of said metal lines functions as a circuit connector, induction heater, radiation reflector, antenna, axle, gear, wheel, lever or combination thereof.

5. A web according to claim 1 wherein said metal lines are copper, iron, cobalt, tin, gold, palladium, platinum, nickel or a combination thereof.

6. A web according to claim 5 wherein said metal lines are copper having a ductility of at least 8 percent.

7. A web according to claim 2 wherein said metal lines are copper, iron, cobalt, tin, gold, palladium, platinum, nickel or a combination thereof.

8. A web according to claim 7 wherein said metal lines are copper having a ductility of at least 8 percent.

* * * * *